US010816884B2

(12) United States Patent
Ishizawa et al.

(10) Patent No.: US 10,816,884 B2
(45) Date of Patent: Oct. 27, 2020

(54) LIGHT EMITTING DEVICE AND PROJECTOR

(71) Applicants: Seiko Epson Corporation, Tokyo (JP); Sophia School Corporation, Tokyo (JP)

(72) Inventors: Shunsuke Ishizawa, Tokyo (JP); Katsumi Kishino, Akiruno (JP)

(73) Assignees: Seiko Epson Corporation (JP); Sophia School Corporation (JP)

( * ) Notice: Subject to any disclaimer, the term of this patent is extended or adjusted under 35 U.S.C. 154(b) by 0 days.

(21) Appl. No.: 16/531,237

(22) Filed: Aug. 5, 2019

(65) Prior Publication Data

US 2020/0041889 A1 Feb. 6, 2020

(30) Foreign Application Priority Data

Aug. 6, 2018 (JP) ................................ 2018-147763

(51) Int. Cl.
*G03B 21/20* (2006.01)
*H01S 5/343* (2006.01)
(Continued)

(52) U.S. Cl.
CPC ...... *G03B 21/2033* (2013.01); *H01S 5/34333* (2013.01); *G03B 21/006* (2013.01); *G03B 33/12* (2013.01)

(58) Field of Classification Search
CPC .......... H01S 5/34333; H01S 5/20; H01S 5/40; H01S 5/4025; H01S 5/4087; H01S 5/4093; G03B 21/006; G03B 33/12
See application file for complete search history.

(56) References Cited

U.S. PATENT DOCUMENTS 8,669,544 B2 3/2014 Mi et al.
2006/0284187 A1 12/2006 Wierer et al.
(Continued)

FOREIGN PATENT DOCUMENTS

JP 2009-238941 A 10/2009
JP 2010-141242 A 6/2010
(Continued)

OTHER PUBLICATIONS

F. Glas et al., "Stress-Driven Island Growth on Top of Nanowires", American Physical Society, Physical Review B 86, 2012, pp. 174112-1-174112-8.

(Continued)

*Primary Examiner* — Armando Rodriguez
(74) *Attorney, Agent, or Firm* — Harness, Dickey & Pierce, P.L.C.

(57) ABSTRACT

A light emitting device has a columnar portion including a light emitting layer, and: (b−a)/L1>(d−c)/L2; a<b; c<d; and a<d, where a is the columnar portion's maximum width as viewed in a laminating direction, at a first position of the columnar portion closest to the substrate in the laminating direction, b is the columnar portion's maximum width, at a second position of the light emitting layer closest to the substrate, c is the columnar portion's maximum width, at a third position of the light emitting layer farthest from the substrate, d is the columnar portion's maximum width, at a fourth position of the columnar portion farthest from the substrate, and L1 is a distance between the first and second positions and L2 is a distance between the third and fourth positions.

10 Claims, 14 Drawing Sheets

(51) Int. Cl.

| | |
|---|---|
| ***G03B 21/00*** | (2006.01) |
| ***G03B 33/12*** | (2006.01) |

(56) References Cited

U.S. PATENT DOCUMENTS

| | | | |
|---|---|---|---|
| 2010/0150194 | A1 | 6/2010 | Tsuchiya et al. |
| 2011/0169025 | A1 | 7/2011 | Kishino et al. |

FOREIGN PATENT DOCUMENTS

| | | | |
|---|---|---|---|
| JP | 2013-009002 | A | 1/2013 |
| JP | 2013-239718 | A | 11/2013 |
| JP | 2014-512667 | A | 5/2014 |

OTHER PUBLICATIONS

M. Funato et al., "Monolithic Polychromatic Light-Emitting Diodes Based on InGaN Microfacet Quantum Wells Toward Tailor-Made Solid-State Lighting", The Japan Society of Applied Physics, Applied Physics Express 1, 2008, pages 011106-1-011106-3.

S. de Sousa Pereira et al., "Role of Nanoscale Strain Inhomogeneity on the Light Emission From InGaN Epilayers", Advanced Functional Materials, vol. 17, 2007, pp. 37-42.

P. Chen et al., "Growth and Optical Properties of Highly Uniform and Periodic InGaN Nanostructures", Advanced Materials, vol. 19, 2007, pp. 1707-1710.

LIGHT EMITTING DEVICE AND PROJECTOR

Japanese Patent Application No. 2018-147763, filed on Aug. 6, 2018, is hereby incorporated by reference in its entirety.

BACKGROUND OF THE INVENTION

The present disclosure relates to a light emitting device and a projector.

Semiconductor lasers are expected to be the next-generation light source that delivers high luminance. Among these, a semiconductor laser to which a nanocolumn has been applied is expected to achieve high-output light emission at narrow radiation angles due to the effect of a photonic crystal resulting from the nanocolumn. Such a semiconductor laser is applied, for example, as a light source of a projector.

In JP-A-2013-9002, for example, there is described a semiconductor light emitting device that includes a columnar portion including an n-type post, a light emitting region post provided on the n-type post, and a p-type post provided on the light emitting region post.

Further, there is known a light emitting device that, in such a light emitting device as described above, includes a columnar portion that gradually increases in width at a uniform rate from the n-type semiconductor layer side toward the p-type semiconductor layer side. According to such a light emitting device, the light generated in an active layer may leak to the p-type semiconductor layer side of the columnar portion, and be absorbed by an electrode provided on the p-type semiconductor layer, for example.

SUMMARY

A light emitting device according to a first aspect of the present disclosure includes a substrate, and a laminate provided to the substrate and including a plurality of columnar portions. The plurality of columnar portions each include a light emitting layer, and the following relations are satisfied: $(b-a)/L1>(d-c)/L2$, $a<b$, $c<d$, and $a<d$, where a is a maximum width of the columnar portion as viewed from a laminating direction of the laminate, at a first position of the columnar portion closest to the substrate in the laminating direction, b is a maximum width of the columnar portion as viewed from the laminating direction, at a second position of the light emitting layer closest to the substrate in the laminating direction, c is a maximum width of the columnar portion as viewed from the laminating direction, at a third position of the light emitting layer farthest from the substrate in the laminating direction, d is a maximum width of the columnar portion as viewed from the laminating direction, at a fourth position of the columnar portion farthest from the substrate in the laminating direction, and L1 is a distance between the first position and the second position and L2 is a distance between the third position and the fourth position in the laminating direction.

A projector according to a second aspect of the present disclosure includes the light emitting device described above.

A light emitting device according to a third aspect of the present disclosure includes a substrate, a laminate provided to the substrate and including a plurality of columnar portions, and an electrode provided to the laminate on a side opposite the substrate side. The plurality of columnar portions each include a light emitting layer, and the following relations are satisfied: $(b-a)/L1>(d-c)/L2$, $a<b$, $c<d$, and $a<d$, where a is a maximum width of the columnar portion as viewed from a laminating direction of the laminate, at a first position of the columnar portion closest to the substrate in the laminating direction, b is a maximum width of the columnar portion as viewed from the laminating direction, at a second position of the light emitting layer closest to the substrate in the laminating direction, c is a maximum width of the columnar portion as viewed from the laminating direction, at a third position of the light emitting layer farthest from the substrate in the laminating direction, d is a maximum width of the columnar portion as viewed from the laminating direction, at a fourth position of a contact region of the columnar portion with the electrode closest to the substrate in the laminating direction, and L1 is a distance between the first position and the second position and L2 is a distance between the third position and the fourth position in the laminating direction.

A projector according to a fourth aspect of the present disclosure includes the light emitting device described above.

DETAILED DESCRIPTION OF THE EMBODIMENT

Figure 1:
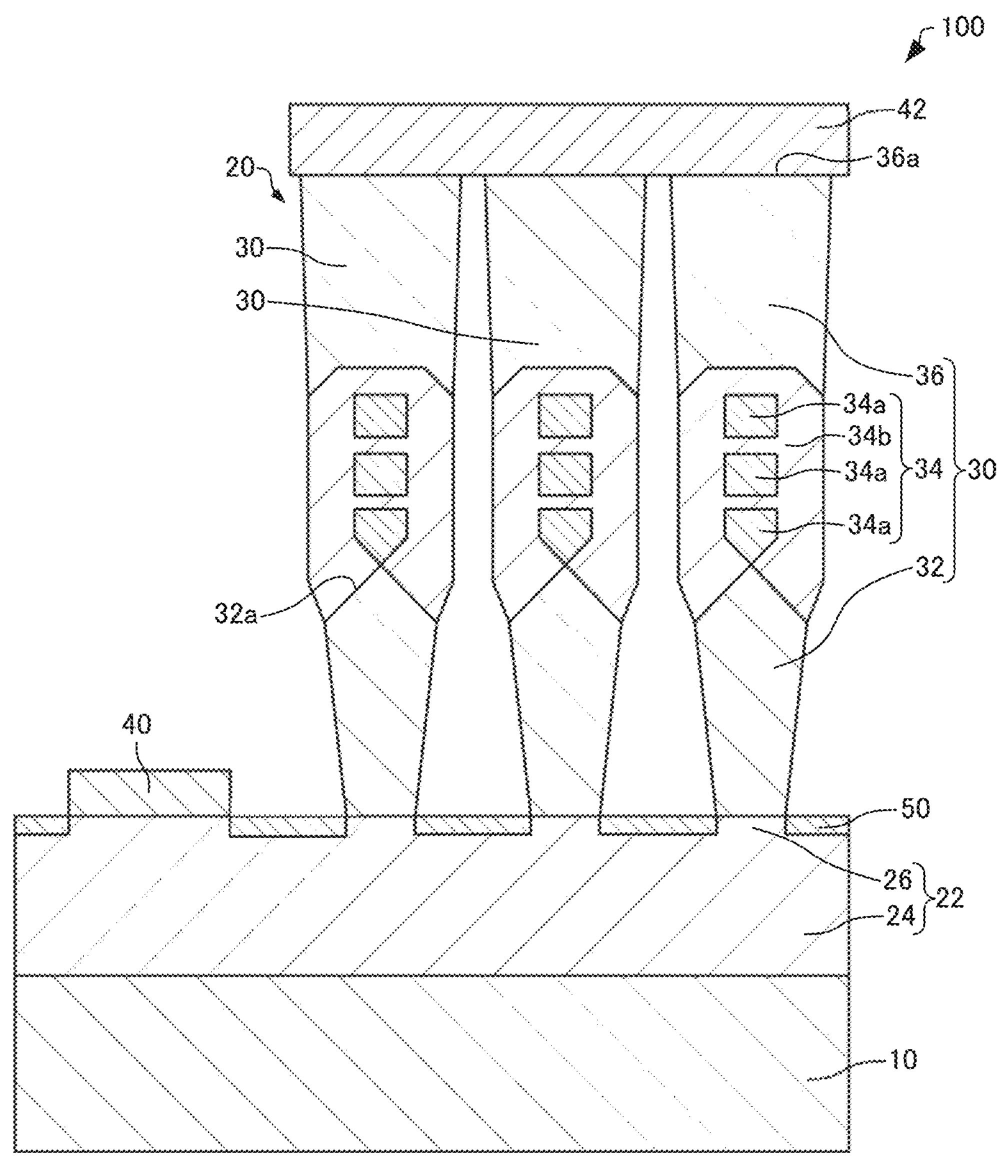
FIG. 1 is a cross-sectional view schematically illustrating a light emitting device according to a first embodiment.

A light emitting device of an embodiment of the present disclosure includes a substrate, and a laminate provided to the substrate and including a plurality of columnar portions. The plurality of columnar portions each include a light emitting layer, and the following relations are satisfied: (b−a)/L1>(d−c)/L2, a<b, c<d, and a<d, where a is a maximum width of the columnar portion as viewed from a laminating direction of the laminate, at a first position of the columnar portion closest to the substrate in the laminating direction, b is a maximum width of the columnar portion as viewed from the laminating direction, at a second position of the light emitting layer closest to the substrate in the laminating direction, c is a maximum width of the columnar portion as viewed from the laminating direction, at a third position of the light emitting layer farthest from the substrate in the laminating direction, d is a maximum width of the columnar portion as viewed from the laminating direction, at a fourth position of the columnar portion farthest from the substrate in the laminating direction, and L1 is a distance between the first position and the second position and L2 is a distance between the third position and the fourth position in the laminating direction.

A light emitting device according to an embodiment of the present disclosure includes a substrate, a laminate provided to the substrate and including a plurality of columnar portions, and an electrode provided to the laminate on a side opposite the substrate side. The plurality of columnar portions each include a light emitting layer, and the following relations are satisfied: (b−a)/L1>(d−c)/L2, a<b, c<d, and a<d, where a is a maximum width of the columnar portion as viewed from a laminating direction of the laminate, at a first position of the columnar portion closest to the substrate in the laminating direction, b is a maximum width of the columnar portion as viewed from the laminating direction, at a second position of the light emitting layer closest to the substrate in the laminating direction, c is a maximum width of the columnar portion as viewed from the laminating direction, at a third position of the light emitting layer farthest from the substrate in the laminating direction, d is a maximum width of the columnar portion as viewed from the laminating direction, at a fourth position of a contact region of the columnar portion with the electrode closest to the substrate in the laminating direction, and L1 is a distance between the first position and the second position and L2 is a distance between the third position and the fourth position in the laminating direction.

In the light emitting device, the light emitting layer may include a first portion, and a second portion having an In concentration lower than the In concentration of the first portion; and the second portion may surround the first portion when viewed from the laminating direction.

In the light emitting device, the light emitting layer may include a plurality of the first portions; the plurality of the first portions may be arranged side by side in the laminating direction; and the second portion may be provided between the first portions adjacent to each other.

In the light emitting device, the plurality of columnar portions may each include a first semiconductor layer, and a second semiconductor layer of a conductivity type different from the conductivity type of the first semiconductor layer, and the light emitting layer may be provided between the first semiconductor layer and the second semiconductor layer.

A projector according to an embodiment of the present disclosure includes any of the light emitting devices described above.

Preferred embodiments of the present disclosure will be described below in detail using the drawings. Note that the embodiments described below do not unduly limit the contents of the present disclosure described in the claims. Moreover, all of the elements described below are not necessarily essential requirements of the present disclosure.

1. First Embodiment

1.1. Light Emitting Device

Figure 2:
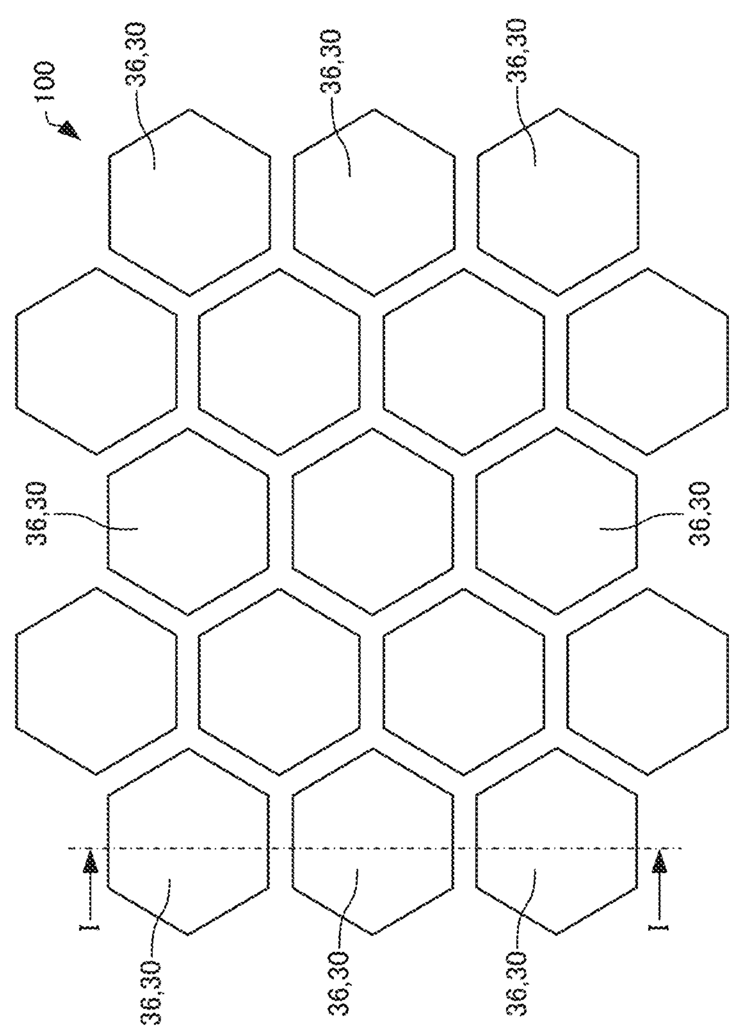
FIG. 2 is a plan view schematically illustrating the light emitting device according to the first embodiment.

First, a light emitting device according to a first embodiment will be described with reference to the drawings. FIG. 1 is a cross-sectional view schematically illustrating a light emitting device 100 according to the first embodiment. FIG. 2 is a plan view schematically illustrating the light emitting device 100 according to the first embodiment. Note that FIG. 1 is a cross-sectional view taken along line I-I of FIG. 2.

As illustrated in FIG. 1 and FIG. 2, the light emitting device 100 includes a substrate 10, a laminate 20, a first electrode 40, and a second electrode 42. Note that, for the sake of convenience, in FIG. 2, members other than a columnar portion 30 of the laminate 20 are omitted.

The substrate 10 has, for example, a plate-like shape. The substrate 10 is, for example, a Si substrate, a GaN substrate, a sapphire substrate, or the like.

The laminate 20 is provided to the substrate 10. In the illustrated example, the laminate 20 is provided on the substrate 10, and the laminate 20 is located on the upper side of the substrate 10. The laminate 20 includes a buffer layer 22 and the columnar portion 30, for example.

Note that, in the present disclosure, "upper" refers to a direction away from the substrate 10 as viewed from a light emitting layer 34 of the columnar portion 30 in a laminating direction of the laminate 20 (hereinafter, also simply referred to as the "laminating direction"), and "lower" refers to a direction toward the substrate 10 as viewed from the light emitting layer 34 in the laminating direction.

Additionally, in the present disclosure, the "laminating direction of the laminate 20" refers to the laminating direction of a first semiconductor layer 32 and the light emitting layer 34 of the columnar portion 30.

The buffer layer 22 is provided on the substrate 10. The buffer layer 22 is, for example, an Si-doped n-type GaN layer, AlGaN layer, or the like. The buffer layer 22 includes a base portion 24 and a convex portion 26, for example. The base portion 24 is provided on the substrate 10. The convex portion 26 and a mask layer 50 configured for forming the columnar portion 30 are provided on an upper surface of the base portion 24. The convex portion 26 is positioned in an opening formed in the mask layer 50.

The columnar portion 30 is provided on the buffer layer 22. A cross-sectional shape of the columnar portion 30 in a direction orthogonal to the laminating direction is, for example, a polygon, a circle, or the like. In the example illustrated in FIG. 2, the cross-sectional shape of the columnar portion 30 is a regular hexagon. A diameter of the columnar portion 30 is, for example, in the order of nanometers, and specifically, is from 10 nm to 500 nm. The columnar portion 30 is also referred to as a nanocolumn, a nanowire, a nanorod, and a nanopillar, for example. A size of the columnar portion 30 in the laminating direction is, for example, from 0.1 μm to 5 μm.

Note that in the present disclosure, "diameter" is, when a planar shape of the columnar portion 30 is a circle, the diameter of the circle and, when the planar shape of the columnar portion 30 is a polygon, the diameter of the smallest circle that includes the polygonal shape, that is, the smallest encompassing circle. Further, "planar shape" refers to a shape as viewed from the laminating direction.

As illustrated in FIG. 1 and FIG. 2, a plurality of the columnar portions 30 are provided. An interval between the columnar portion 30 adjacent to each other is, for example, from 1 nm to 30 nm. The plurality of columnar portions 30 are arranged at a predetermined pitch in a predetermined direction as viewed from the laminating direction. In the example illustrated in FIG. 2, the plurality of columnar portions 30 are arranged in an equilateral triangle lattice-like manner in a plan view. The plurality of columnar portions 30 are, for example, arranged in a closest-packed state as viewed from the laminating direction. The plurality of columnar portions 30 can exhibit the effect of a photonic crystal.

As illustrated in FIG. 1, the columnar portion 30 includes the first semiconductor layer 32, the light emitting layer 34, and a second semiconductor layer 36.

The first semiconductor layer 32 is provided on the buffer layer 22. The first semiconductor layer 32 is provided between the substrate 10 and the light emitting layer 34. The first semiconductor layer 32 is, for example, an Si-doped n-type GaN layer, AlGaN layer, or the like. The first semiconductor layer 32 includes a first contact region 32*a* that comes into contact with the light emitting layer 34. The first contact region 32*a* is an upper surface of the first semiconductor layer 32. In the illustrated example, the first contact area 32*a* is a faceted surface.

The light emitting layer 34 is provided on the first semiconductor layer 32. The light emitting layer 34 is provided between the first semiconductor layer 32 and the second semiconductor layer 36. The light emitting layer 34 is an i-type semiconductor layer without doped impurities. The light emitting layer 34 is a layer capable of generating light by being injected with a current.

The light emitting layer 34 includes a first portion 34*a* and a second portion 34*b*. The first portion 34*a* and the second portion 34*b* are InGaN layers, for example. A concentration of indium (In) in the second portion 34*b* is lower than the concentration of In in the first portion 34*a*. A band gap of the second portion 34*b* is greater than a band gap of the first portion 34*a*. As viewed from the laminating direction, the second portion 34*b* surrounds the first portion 34*a*. A plurality of the first portions 34*a* are provided. The plurality of first portions 34*a* are arranged side by side in the laminating direction. The second portion 34*b* is provided between the first portions 34*a* adjacent to each other. In the example illustrated, three first portions 34*a* are provided. The light emitting layer 34 includes a well structure constituted of the first portion 34*a* and the second portion 34*b*.

Note that the light emitting layer 34 may include a guide layer having a semiconductor superlattice (SL) structure configured by a GaN layer and an InGaN layer, for example. In this case, the guide layer may include the first portion 34*a* and the second portion 34*b*.

The second semiconductor layer 36 is provided on the light emitting layer 34. The second semiconductor layer 36 is a layer of a conductive type different from the conductive type of the first semiconductor layer 32. The second semiconductor layer 36 is, for example, an Mg-doped p-type GaN layer, AlGaN layer, or the like. The second semiconductor layer 36 includes a second contact region 36*a* that comes into contact with the second electrode 42. The second contact region 36*a* is an upper surface of the second semiconductor layer 36. In the illustrated example, the second contact area 36*a* is a flat surface. The first semiconductor layer 32 and the second semiconductor layer 36 are cladding layers having a function of confining light to the light emitting layer 34.

In the light emitting device 100, a pin diode is constituted by the p-type second semiconductor layer 36, the light emitting layer 34 without doped impurities, and the n-type first semiconductor layer 32. In the light emitting device 100, when a forward bias voltage of the pin diode is applied between the first electrode 40 and the second electrode 42, a current is injected into the light emitting layer 34, and recombination of the electrons and holes in the light emitting layer 34 occurs. This recombination results in light emission. The light emitted in the light emitting layer 34 propagates in a direction orthogonal to the laminating direction by the first semiconductor layer 32 and the second semiconductor layer 36, forms a standing wave due to the effect of the photonic crystal by the plurality of columnar portions 30, and carries out laser oscillation with gain in the light emitting layer 34. Then, the light emitting device 100 emits positive first order diffracted light and negative first order diffracted light as laser light in the laminating direction.

Note that, although not illustrated, a reflective layer may be provided between the substrate 10 and the buffer layer 22 or below the substrate 10. The reflective layer is, for example, a distributed Bragg reflector (DBR) layer. Light generated in the light emitting layer 34 can be reflected by the reflective layer, and thus the light emitting device 100 can emit light only from the second electrode 42 side.

Figure 3:
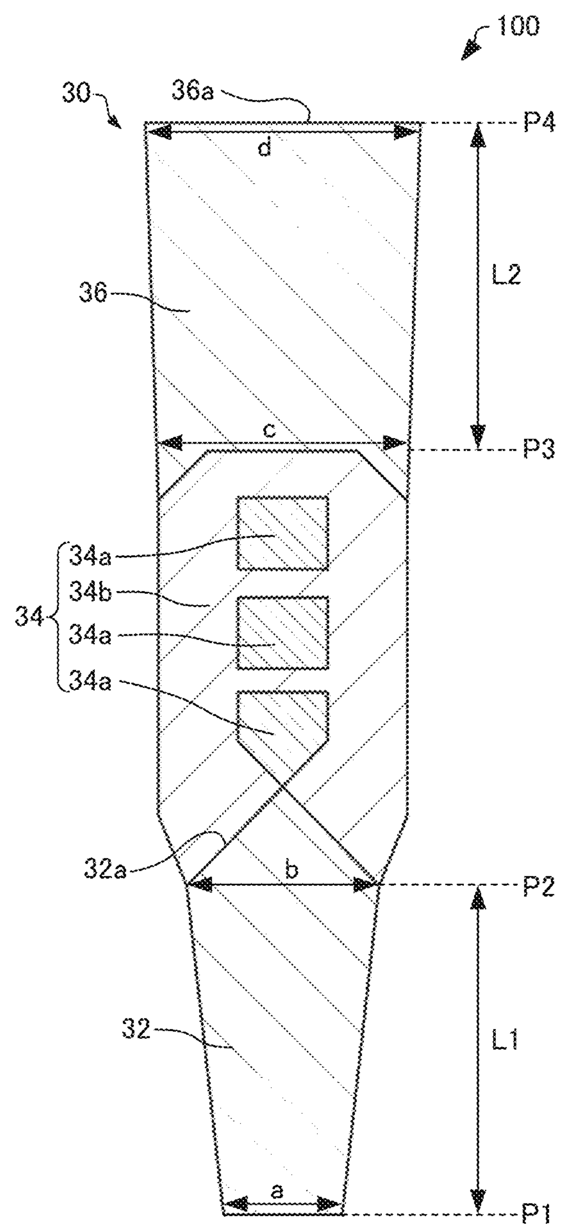
FIG. 3 is a cross-sectional view schematically illustrating a columnar portion of the light emitting device according to the first embodiment.

Here, FIG. 3 is a cross-sectional view schematically illustrating the columnar portion 30 of the light emitting device 100. As illustrated in FIG. 3, a first position P1 is the position of the columnar portion 30 closest to the substrate 10 side in the laminating direction. In the illustrated example, the first position P1 is, for example, the position of a contact region of the columnar portion 30 with the buffer layer 22. A second position P2 is the position of the light emitting layer 34 closest to the substrate 10 side in the laminating direction. A third position P3 is the position of the light emitting layer 34 farthest side from the substrate 10 in the laminating direction. A fourth position P4 is the position of the columnar portion 30 farthest side from the substrate 10 in the laminating direction. The fourth position P4 is, for example, the position of the second contact region 36*a* of the columnar portion 30 with the second electrode 42.

In the light emitting device 100, the relationships of Formulae (1) below are satisfied: where a is a maximum width of the columnar portion 30 at the first position P1, b is a maximum width of the columnar portion 30 at the second position P2, c is a maximum width of the columnar portion 30 at the third position P3, and d is a maximum width of the columnar portion 30 at the fourth position P4 as viewed from the laminating direction, and L1 is a distance between the first position P1 and the second position P2, and L2 is a distance between the third position P3 and the fourth position P4 in the laminating direction.

$$(b-a)/L1>(d-c)/L2,\ a<b,\ c<d,\ \text{and}\ a<d \qquad (1)$$

In Formulae (1), (b−a)/L1 is, for example, an enlargement ratio (hereinafter, also referred to as "first enlargement ratio") of the maximum width of the columnar portion 30 below the light emitting layer 34, from the substrate 10 side toward the second electrode 42 side. (d−c)/L2 is, for example, an enlargement ratio (hereinafter, also referred to as "second enlargement ratio") of the maximum width of the columnar portion 30 above the light emitting layer 34, from the substrate 10 side toward the second electrode 42 side. Note that "maximum width of the columnar portion" is, when the planar shape of the columnar portion 30 is a circle, the diameter of the circle and, when the planar shape of the columnar portion 30 is a polygon, the diameter of the smallest circle that includes the polygonal shape.

The first electrode 40 is provided on the buffer layer 22. The buffer layer 22 may be in ohmic contact with the first electrode 40. The first electrode 40 is electrically coupled to the first semiconductor layer 32. In the illustrated example, the first electrode 40 is electrically coupled to the first semiconductor layer 32 via the buffer layer 22. The first electrode 40 is one electrode configured for injecting current into the light emitting layer 34. Examples of the first electrode 40 include an electrode obtained by laminating a Ti layer, an Al layer, and an Au layer in order from the buffer layer 22 side. Note that, although not illustrated, when the substrate 10 is conductive, the first electrode 40 may be provided below the substrate 10.

The second electrode 42 is provided to the laminate 20 side opposite the substrate 10 side. In the illustrated example, the second electrode 42 is provided on the second semiconductor layer 36. The second semiconductor layer 36 may be in ohmic contact with the second electrode 42. The second electrode 42 is electrically coupled to the second semiconductor layer 36. The second electrode 42 is another electrode configured for injecting current into the light emitting layer 34. Examples of the second electrode 42 include indium tin oxide (ITO) or the like.

The light emitting device 100 has the following characteristics, for example.

In the light emitting device 100, Formulae (1) described above are satisfied. Therefore, in the light emitting device 100, the second enlargement ratio of the columnar portion 30 above the light emitting layer 34 is smaller than the first enlargement ratio of the columnar portion 30 below the light emitting layer 34. Thus, in the light emitting device 100, compared to a case where, for example, the second enlargement ratio is the same as the first enlargement ratio, an average refractive index of the columnar portion 30 above the light emitting layer 34 can be reduced. Specifically, the average refractive index in a planar direction of the second semiconductor layer 36 can be reduced. Thus, in the light emitting device 100, an amount of light leaking from the upper portion side of the columnar portion 30, specifically, the amount of light leaking toward the second semiconductor layer 36 side of the columnar portion 30, can be reduced and, for example, the amount of light absorbed by the second electrode 42 can be reduced. Further, for example, a light intensity near the light emitting layer 34 can be increased.

Note that the "average refractive index in the planar direction" refers to the average refractive index in a direction orthogonal to the laminating direction at a predetermined position in the laminating direction. For example, given $n_{AVE}$ as the average refractive index in the planar direction of a portion of the laminate 20 where the columnar portion 30 is provided, $n_{AVE}$ is expressed as Formula (2) below.

$$n_{AVE}=\sqrt{\varepsilon_A \cdot \phi+\varepsilon_B(1-\phi)} \quad (2)$$

Where in Formula (2), $\varepsilon_A$ is a dielectric constant of the columnar portion 30, and $\varepsilon_B$ is a dielectric constant of a portion between the plurality of columnar portions 30 and, in the illustrated example, is the dielectric constant of air. $\Phi$ is a ratio of a sum total of the areas of the plurality of columnar portions 30 to a total of a sum total of the areas of the plurality of columnar portions 30 in the planar direction and a sum total of the areas of the portions between the plurality of columnar portions 30, and can also be referred to as a filling ratio of the columnar portion 30.

In the light emitting device 100, the light emitting layer 34 includes the first portion **34*a*, and the second portion 34*b* having an In concentration lower than the In concentration of the first portion 34*a*. The second portion 34*b* surrounds the first portion 34*a* when viewed from the laminating direction. Therefore, in the light emitting device 100, as in experimental examples described below, variations in a wavelength of the emitted light are small, and thus light having a high pure color property can be emitted. As a result, in the light emitting device 100**, light of an oscillation wavelength can be efficiently amplified, an absorption loss can be reduced, and an oscillation threshold value can be reduced.

In the light emitting device 100, the light emitting layer 34 includes a plurality of the first portions **34*a*. The plurality of first portions 34*a* are arranged side by side in the laminating direction, and the second portion 34*b* is provided between the first portions 34*a* adjacent to each other. Thus, in the light emitting device 100, even if excessive In is precipitated and stays on the crystal surface when the first portion 34*a* is formed, the excessive In can be incorporated into the second portion 34*b* by forming the second portion 34*b* on the first portion 34*a***, for example, and the excessive In can be removed.

In the light emitting device 100, the columnar portion 30 includes the first semiconductor layer 32, and the second semiconductor layer 36 of a conductivity type different from the conductivity type of the first semiconductor layer 32. The light emitting layer 34 is provided between the first semiconductor layer 32 and the second semiconductor layer 36. Thus, in the light emitting device 100, the pin diode can be constituted by the p-type second semiconductor layer 36, the light emitting layer 34 without doped impurities, and the n-type first semiconductor layer 32.

Note that, in the description above, the light emitting device 100 is a laser, but the light emitting device according to the present disclosure may be a light emitting diode (LED).

1.2. Method for Manufacturing Light Emitting Device

Figure 4:
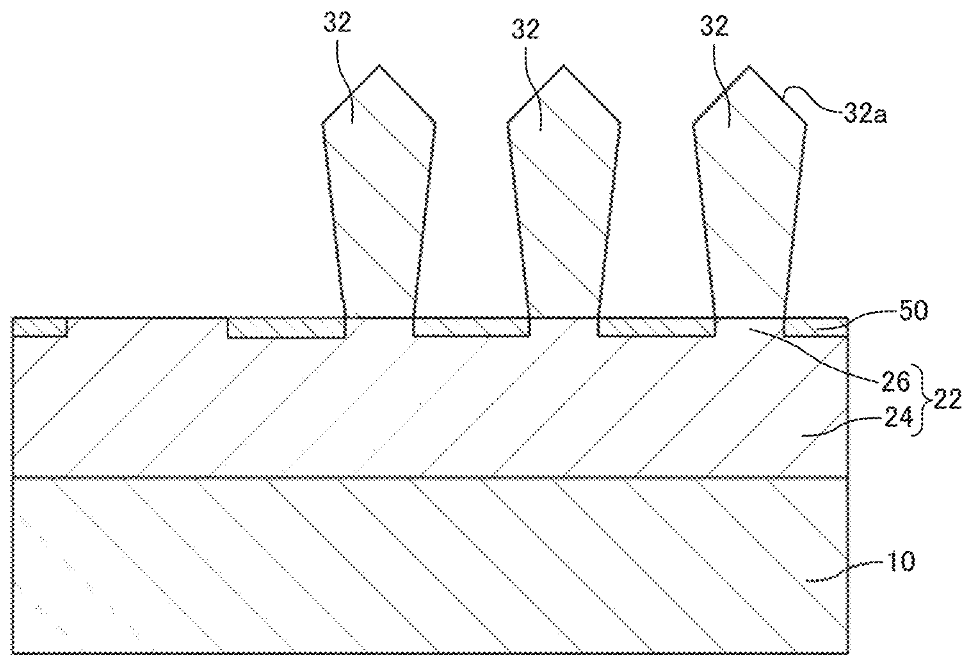
FIG. 4 is a cross-sectional view schematically illustrating a manufacturing step of the light emitting device according to the first embodiment.
Figure 5:
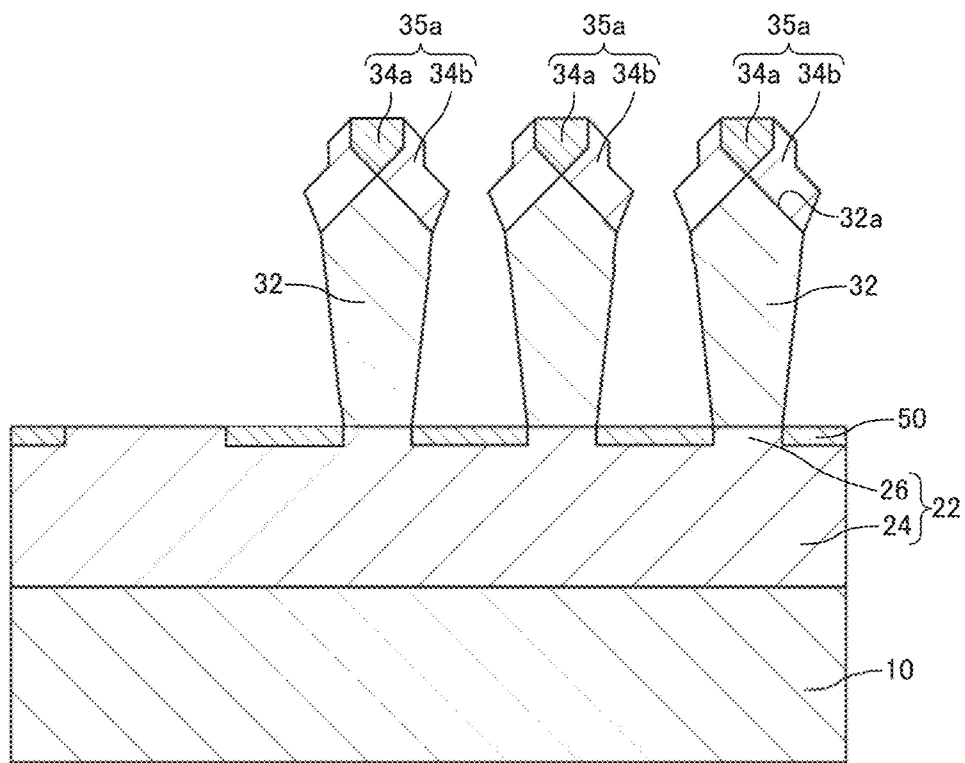
FIG. 5 is a cross-sectional view schematically illustrating a manufacturing step of the light emitting device according to the first embodiment.
Figure 6:
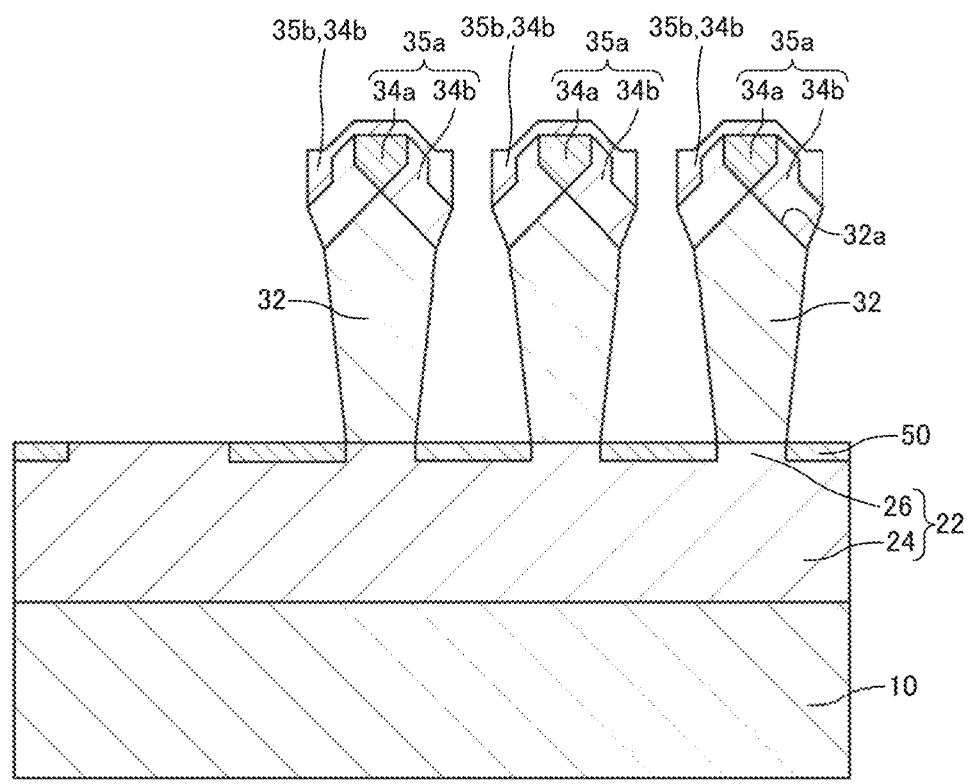
FIG. 6 is a cross-sectional view schematically illustrating a manufacturing step of the light emitting device according to the first embodiment.

Next, the method for manufacturing the light emitting device 100 according to the first embodiment will be described with reference to the drawings. FIG. 4 to FIG. 6 is a cross-sectional view schematically illustrating manufacturing steps of the light emitting device 100 according to the first embodiment.

As illustrated in FIG. 4, the base portion 24 of the buffer layer 22 is epitaxially grown on the substrate 10. Examples of the method of epitaxial growth include a molecular beam epitaxy (MBE) method. More specifically, examples include an MBE (RF-MBE) method utilizing a high frequency plasma nitrogen source.

Next, the mask layer 50 is formed on the buffer layer 22. The mask layer 50 is, for example, a silicon oxide layer, a titanium oxide layer, a titanium layer, a layered film of these, or the like. The mask layer 50 is formed by film formation using, for example, electron beam deposition, plasma chemical vapor deposition (CVD), or the like, and patterning using photolithography and etching techniques.

Next, the convex portion 26 of the buffer layer 22 and the first semiconductor layer 32 are epitaxially grown on the base portion 24 of the buffer layer 22 by RF-MBE, for example, with the mask layer 50 as a mask.

As illustrated in FIG. 5, a first layer **35*a* is epitaxially grown on the first semiconductor layer 32 by RF-MBE, for example. The first layer 35***a* includes indium (In), gallium (Ga), and nitrogen (N). The first layer 35*a* is grown with the In irradiation ratio set to a predetermined value or higher, suppressing the growth of InGaN on all surfaces of the first contact region 32*a* of the first semiconductor layer 32, and thus causing the In to migrate over the first contact region 32*a* and crystals to be precipitated in a c-axis direction relative to an apex portion of the first semiconductor layer 32. At this time, the InGaN aggregates in a center portion of the columnar portion 30 and grows into a dot shape in order to avoid accumulation of lattice strain with the GaN layer, for example. As a result, the first portion 34*a* and the second portion 34*b* having a lower concentration of In than the first portion 34*a* are formed. Although not illustrated, the excessive In is precipitated and stays on the crystal surface during growth. A growth temperature of the first layer 35*a* is, for example, from 600° C. to 700° C.

As illustrated in FIG. 6, a second layer 35*b* is epitaxially grown on the first layer 35*a* by RF-MBE, for example. In the growth of the second layer 35*b*, the irradiation of In is blocked, and only Ga and N are irradiated. As a result, the precipitated In is incorporated into the crystal to form InGaN. In addition, the precipitate In is evaporated and removed by heat during growth of the second layer 35*b*. As a result, the second portion 34*b* can be formed on the first portion 34*a*. A growth temperature of the second layer 35*b* is, for example, from 600° C. to 900° C.

After the precipitated In is removed, In irradiation is resumed and InGaN is grown. With repeated In irradiation and blocking as described above, three first portions 34*a* having a high concentration of In can form a light emitting layer 34 covered by the second portion 34*b* having a low In concentration, as illustrated in FIG. 1. Note that, for the sake of convenience, FIG. 1 generally illustrates the second portion 34*b* of the first layer 35*a* and the second portion 34*b* of the second layer 35*b*.

Here, as viewed from the laminating direction, a diameter of the first portion 34*a* is determined from a difference between lattice constants of InGaN and GaN, for example. As a result, the variation in diameter between the plurality of columnar portions 30 can be reduced, and highly uniform light emission characteristics can be obtained.

As illustrated in FIG. 1, the second semiconductor layer 36 is epitaxially grown on the light emitting layer 34 by RF-MBE, for example. As a result, the columnar portion 30 can be formed.

Note that by reducing the growth temperature of the second semiconductor layer 36 and the light emitting layer 34 to about 200° C., for example, lower than the growth temperature of the first semiconductor layer 32, the diameter of the second semiconductor layer 36 and the light emitting layer 34 can be made greater than the diameter of the first semiconductor layer 32.

In addition, the second semiconductor layer 36 is doped with Mg, for example, and thus the diameter tends to increase. However, as illustrated in FIG. 2, when viewed from the laminating direction, a distance between the plurality of columnar portions 30 can be reduced by arranging the columnar portions 30 having a planar shape of a regular hexagonal shape into an equilateral triangle lattice manner in a closest-packed state. Therefore, the raw material when the second semiconductor layer 36 is grown is less likely to enter between the plurality of columnar portions 30 (shadow effect), making it possible to keep the diameter of the second semiconductor layer 36 from becoming too large relative to the diameter of the light emitting layer 34. The distance between the plurality of columnar portions 30 is the distance across which the shadow effect is exhibited when the second semiconductor layer 36 is grown, and the shadow effect and such growth temperature makes it possible to form the columnar portion 30 that satisfies Formulae (1).

Next, the first electrode 40 is formed on the buffer layer 22, and the second electrode 42 is formed on the second semiconductor layer 36. The first electrode 40 and the second electrode 42 are formed by, for example, a vacuum deposition method or the like. Note that the order of formation of the first electrode 40 and the second electrode 42 is not particularly limited.

According to the above steps, the light emitting device 100 can be manufactured.

2. Second Embodiment

2.1. Light Emitting Device

Figure 7:
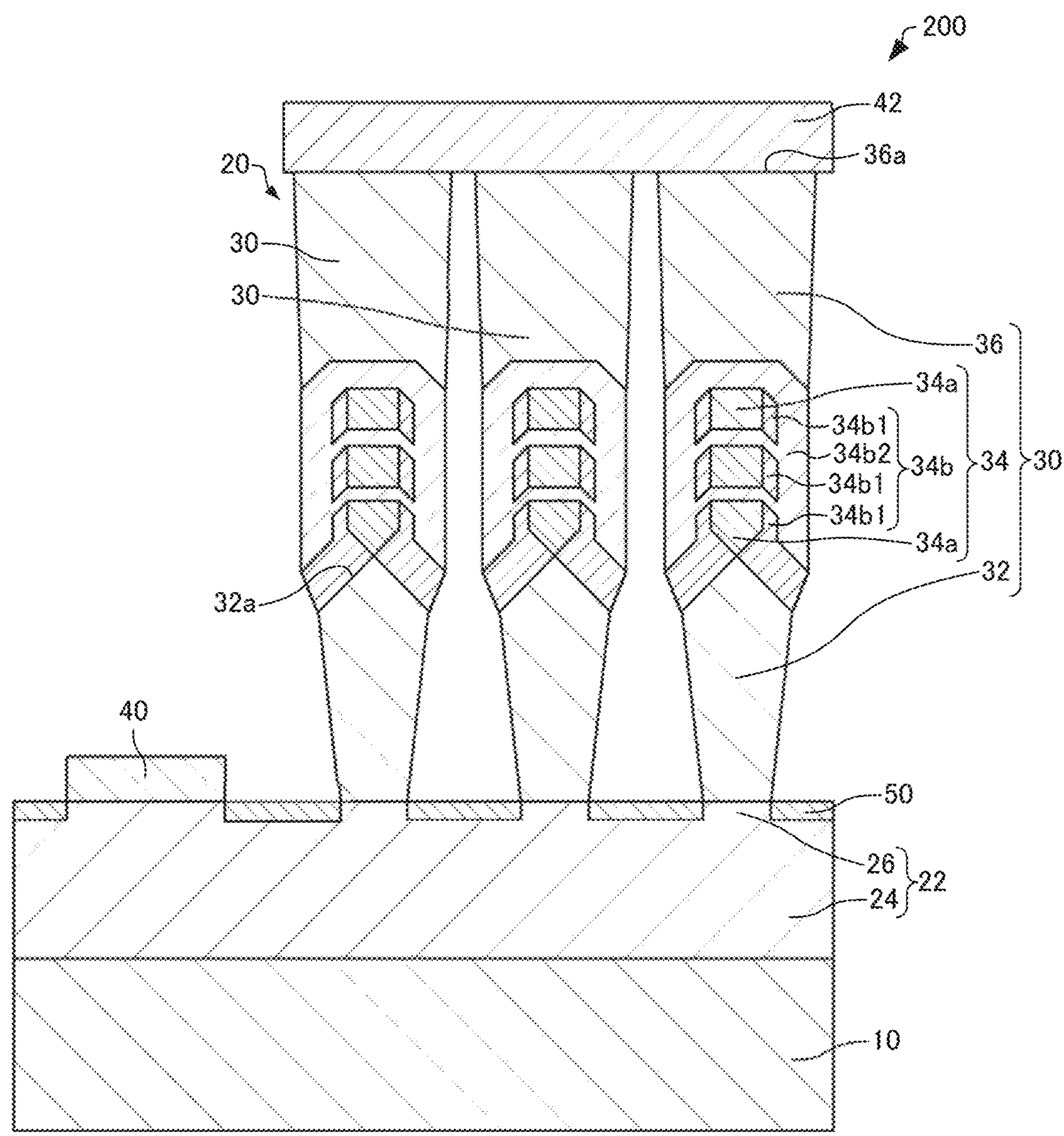
FIG. 7 is a cross-sectional view schematically illustrating the light emitting device according to a second embodiment.

Next, the light emitting device according to a second embodiment will be described with reference to the drawings. FIG. 7 is a cross-sectional view schematically illustrating a light emitting device 200 according to the second embodiment.

Hereinafter, members of the light emitting device 200 according to the second embodiment having the same function as the constituent members of the light emitting device 100 according to the first embodiment described above are denoted using the same reference numerals, and detailed descriptions will be omitted.

In the light emitting device 100 described above, the second portion 34*b* of the light emitting layer 34 is an InGaN layer. In contrast, in the light emitting device 200, as illustrated in FIG. 7, the second portion 34*b* includes a first region 34*b*1 that is an InGaN layer, and a second region 34*b*2 that is a GaN layer.

The concentration of In in the second portion 34*b*1 is lower than the concentration of In in the first portion 34*a*. The second region 34*b*2 surrounds the first portion 34*a* and the first region 34*b*1 as viewed from the laminating direction.

2.2. Method for Manufacturing Light Emitting Device

Next, the method for manufacturing the light emitting device 200 according to the second embodiment will be described. The method of manufacturing the light emitting device 200 is basically the same as the method for manufacturing the light emitting device 100 according to the first embodiment described above except that, for example, compared to the light emitting device 100, the growth time of the second layer 35*b* irradiating only Ga and N is increased with blocking the irradiation of In when the light emitting layer 34 is formed. Therefore, the description of the method is omitted.

2.3. Modified Example of Light Emitting Device

Figure 8:
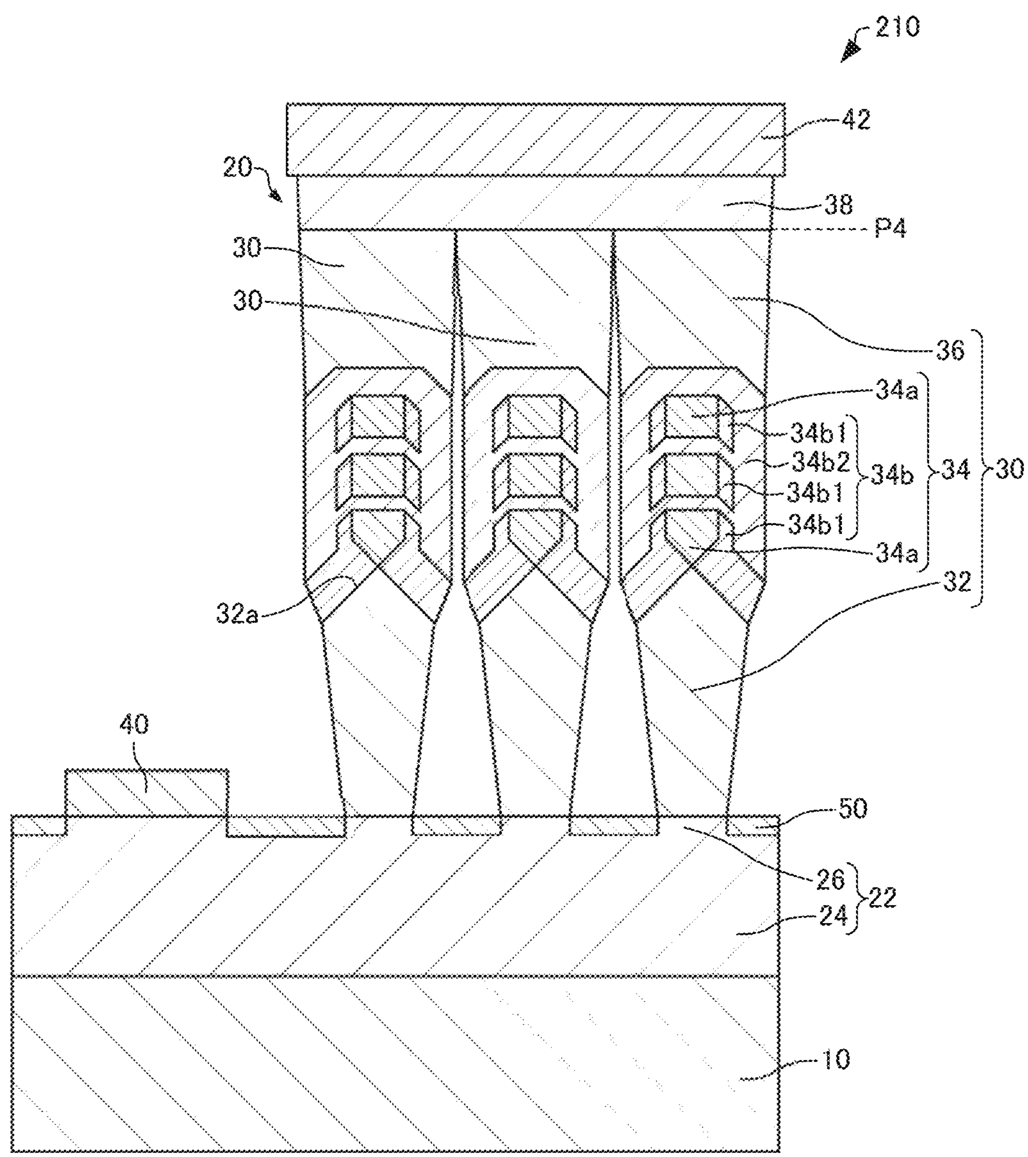
FIG. 8 is a cross-sectional view schematically illustrating the light emitting device according to a modified example of the second embodiment.

Next, the light emitting device according to a modified example of the second embodiment will be described with reference to the drawings. FIG. 8 is a cross-sectional view schematically illustrating a light emitting device 210 according to the modified example of the second embodiment.

Hereinafter, members of the light emitting device 210 according to the modified example of the second embodiment having the same function as the constituent members of the light emitting device 200 according to the second embodiment described above are denoted using the same reference numerals, and detailed descriptions will be omitted.

In the light emitting device 210, as illustrated in FIG. 8, the laminate 20 differs from that in the light emitting device 200 described above in that the laminate 20 includes a third semiconductor layer 38.

The third semiconductor layer 38 is provided between the columnar portion 30 and the second electrode 42. The third semiconductor layer 38 is, for example, a layer linking the plurality of columnar portions 30. A material of the third semiconductor layer 38 is, for example, the same as that of the second semiconductor layer 36. In the illustrated example, the fourth position P4 is the position of a contact region of the columnar portion 30 with the third semiconductor layer 38. The light emitting device 210 has a smaller distance between adjacent columnar portions 30 compared to the distance between adjacent columnar portions 30 of the light emitting device 200, for example.

In the light emitting device 210, after the second semiconductor layer 36 is grown on the light emitting layer 34 to form the columnar portion 30, the third second semiconductor layer 38 can be formed by further growing a GaN layer.

3. Third Embodiment

3.1. Light Emitting Device

Figure 9:
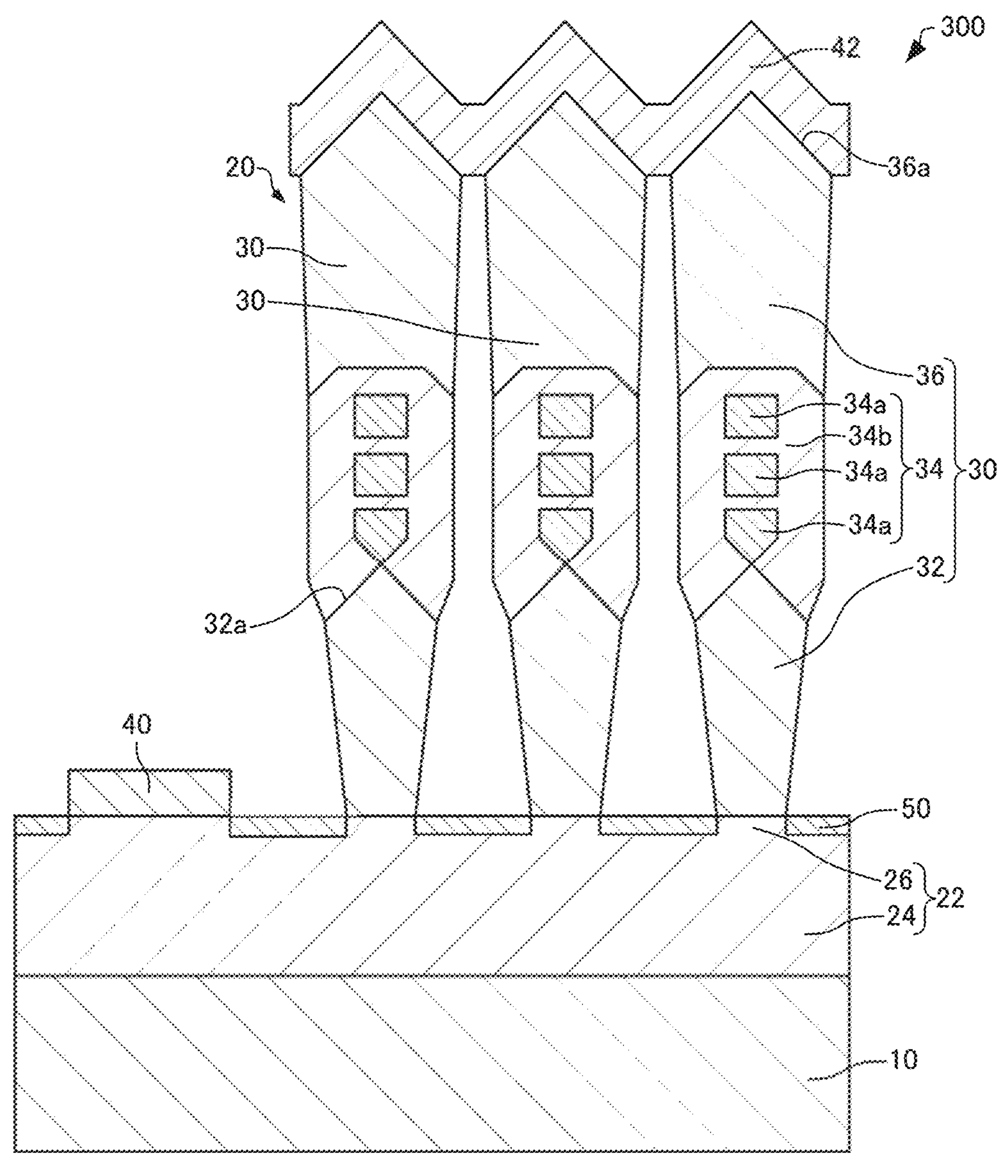
FIG. 9 is a cross-sectional view schematically illustrating the light emitting device according to a third embodiment.

Next, the light emitting device according to a third embodiment will be described with reference to the drawings. FIG. 9 is a cross-sectional view schematically illustrating a light emitting device 300 according to the third embodiment.

Hereinafter, members of the light emitting device 300 according to the third embodiment having the same function as the constituent members of the light emitting device 100 according to the first embodiment described above are denoted using the same reference numerals, and detailed descriptions will be omitted.

In the light emitting device 100, as illustrated in FIG. 1, the second contact region 36*a* is a flat surface. In contrast, in the light emitting device 300, as illustrated in FIG. 9, the second contact region 36*a* is a faceted surface.

Figure 10:
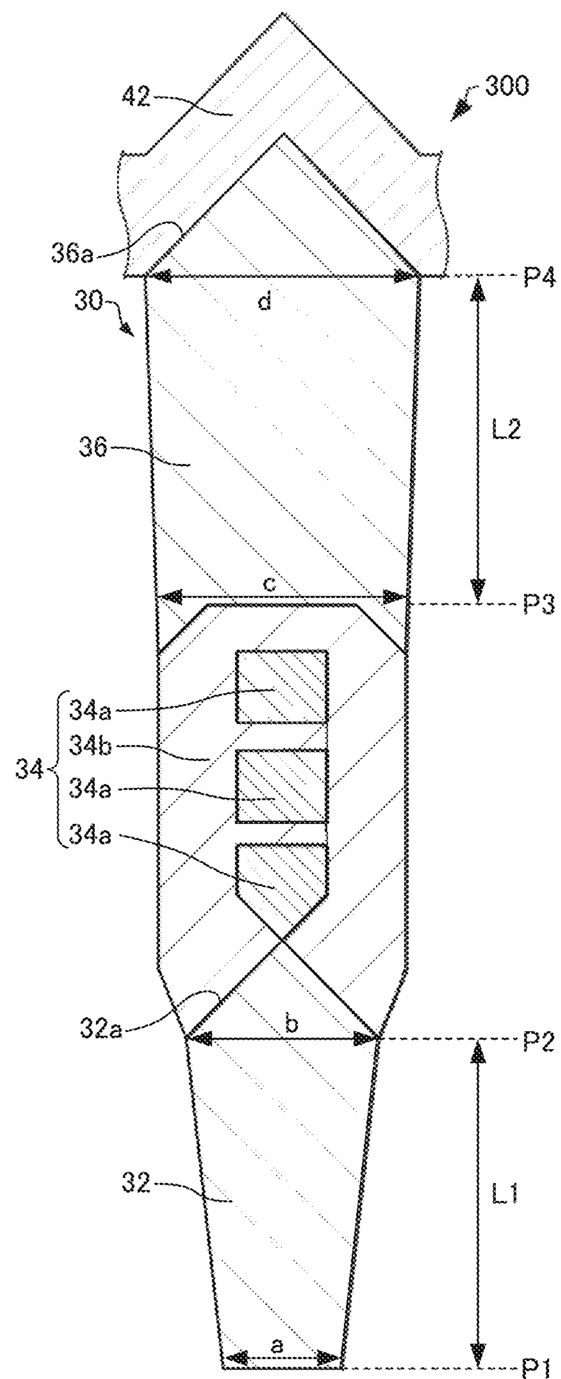
FIG. 10 is a cross-sectional view schematically illustrating the columnar portion of the light emitting device according to the third embodiment.

Here, FIG. 10 is a cross-sectional view schematically illustrating the columnar portion 30 and the second electrode 42 of the light emitting device 300. In the light emitting device 300, as illustrated in FIG. 10, the fourth position P4 is a position on the substrate 10 side of the second contact region 36*a* in the laminating direction.

In the light emitting device 300, similar to the light emitting device 100, the amount of light leaking toward the second semiconductor layer 36 side of the columnar portion 30, can be reduced, and for example, the amount of light absorbed by the second electrode 42 can be reduced.

3.2. Method for Manufacturing Light Emitting Device

Next, the method for manufacturing the light emitting device 300 according to the third embodiment will be described. The method for manufacturing the light emitting device 300 is basically the same as the method for manufacturing the light emitting device 100 according to the first embodiment described above except that the second contact region 36*a* is a faceted surface formed by adjusting the growth temperature and film-forming rate of the second semiconductor layer 36. Therefore, the description of the method will be omitted. Note that, in the method for manufacturing the light emitting device 100, after formation of the second semiconductor layer 36 having the faceted surface, the second contact region 36*a* may be formed as a flat surface by etching or the like.

4. Fourth Embodiment

Figure 11:
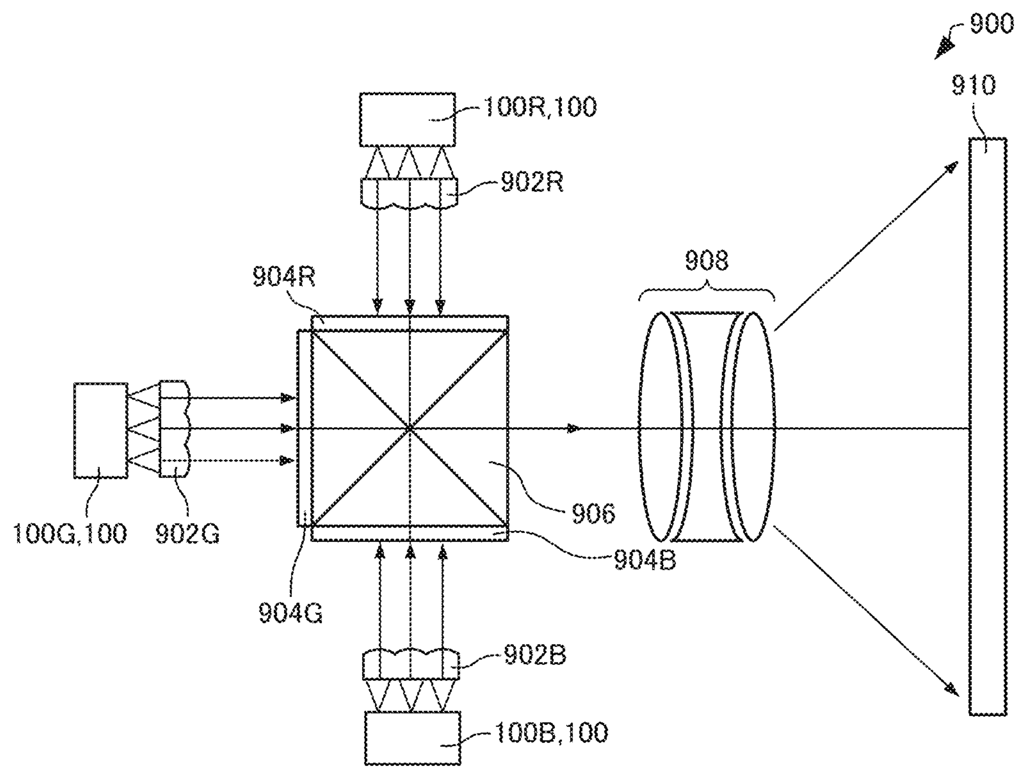
FIG. 11 is a diagram schematically illustrating a projector according to a fourth embodiment.

Next, a projector according to a fourth embodiment will be described with reference to the drawings. FIG. 11 is a diagram schematically illustrating a projector 900 according to the fourth embodiment.

The projector according to the present disclosure includes the light emitting device according to the present disclosure. The projector 900 including the light emitting device 100 as the light emitting device according to the present disclosure will be described below.

The projector 900 includes a housing (not illustrated) and a red light source 100R, a green light source 100G, and a blue light source 100B that emit red light, green light, and blue light, respectively, provided inside the housing. Each of the red light source 100R, the green light source 100G, and the blue light source 100B is a plurality of the light emitting devices 100 being arranged in an array in a direction orthogonal to the laminating direction with the substrate 10 being a common substrate in the plurality of light emitting devices 100. The number of the light emitting devices 100 respectively constituting the red light source 100R, the green light source 100G, and the blue light source 100B is not particularly limited. Note that, for the sake of convenience, in FIG. 11, the red light source 100R, the green light source 100G, and the blue light source 100B are simplified.

The projector 900 further includes a first lens array 902R, a second lens array 902G, a third lens array 902B, a first light modulating device 904R, a second light modulating device 904G, a third light modulating device 904B, and a projection device 908 in the housing. The first light modulating device 904R, the second light modulating device 904G, and the third light modulating device 904B are, for example, transmissive-type liquid crystal light valves. The projection device 908 is, for example, a projection lens.

Light emitted from the red light source 100R is incident on the first lens array 902R. Light emitted from the red light source 100R can be focused by the first lens array 902R and, for example, superimposed.

The light focused by the first lens array 902R is incident on the first light modulating device 904R. The first light modulating device 904R modulates the incident light in accordance with picture image information. Then, the projection device 908 enlarges an image formed by the first light modulating device 904R and projects the image onto a screen 910.

Light emitted from the red light source 100G is incident on the first lens array 902G. Light emitted from the green light source 100G can be focused by the second lens array 902G and, for example, superimposed.

The light focused by the second lens array 902G is incident on the second light modulating device 904G. The second light modulating device 904G modulates the incident light in accordance with picture image information. Then, the projection device 908 enlarges an image formed by the second light modulating device 904G and projects the image onto the screen 910.

Light emitted from the blue light source 100B is incident on the third lens array 902B. Light emitted from the blue light sour 100B can be focused by the third lens array 902B and, for example, superimposed.

The light focused by the third lens array 902B is incident on the third light modulating device 904B. The third light modulating device 904B modulates the incident light in accordance with picture image information. Then, the projection device 908 enlarges an image formed by the third light modulating device 904B and projects the image onto the screen 910.

Further, the projector 900 may include a cross dichroic prism 906 that synthesizes the light emitted from a first light modulating device 904R, the second light modulating device 904G, and the third light modulating device 904B, and guides the light to the projection device 908.

The respective three color lights modulated by the first light modulating device 904R, the second light modulating device 904G, and the third light modulating device 904B are incident on the cross dichroic prism 906. The cross dichroic prism 906 is formed by bonding four right angle prisms, and a dielectric multilayer film that reflects red light and a dielectric multilayer film that reflects blue light are arranged in a criss-cross manner on an inner surface of the cross dichroic prism 906. The respective three color lights are synthesized by these dielectric multilayer films, and light representing the color picture image is formed. Then, the synthesized light is projected onto the screen 910 by the projection device 908, and an enlarged picture image is displayed.

Note that the red light source 100R, the green light source 100G, and the blue light source 100B may directly form a video image without using the first light modulating device 904R, the second light modulating device 904G, and the third light modulating device 904B, by controlling the light emitting device 100 as video image pixels in accordance with picture image information. Then, the projection device 908 enlarges the video image formed by the red light source 100R, the green light source 100G, and the blue light source 100B, and projects the video image onto the screen 910.

Further, while a transmissive-type liquid crystal light valve is used as the light modulating device in the example described above, a light valve other than a liquid crystal may be used, or a reflective-type light valve may be used. Examples of such a light valve include a reflective-type liquid crystal light valve and a digital micromirror device. Further, the configuration of the projection device is changed as appropriate, depending on the type of light valve used.

Further, by scanning the light from the light source onto the screen, it is possible to also apply the light source to a light source device of a scanning type picture image display device including scanning unit, which is a picture image forming device that displays a picture image of a desired size on the display surface.

Application of the light emitting device according to the present disclosure is not limited to the embodiment described above, and can be used in other applications in addition to a projector. Applications other than a projector include a light source such as an indoor or outdoor light, a display backlight, a laser printer, a scanner, an on-board light, a sensing apparatus that uses light, a communication apparatus, or the like.

5. Experimental Examples

The present disclosure will be more specifically described below using experimental examples. Note that the present disclosure is not limited in any way by the following experimental examples.

5.1. First Experiment

5.1.1. Fabrication of Sample

An experiment of InGaN crystal growth on GaN columnar crystals was conducted using the RF-MBE method. Specifically, In, Ga, and N were simultaneously supplied for 30 minutes to grow InGaN crystals on GaN columnar crystals, and Ga and N were further simultaneously supplied for five minutes to grow GaN crystals on the InGaN crystals, thus forming a nanocolumn.

5.1.2. SEM Observation

Figure 12:
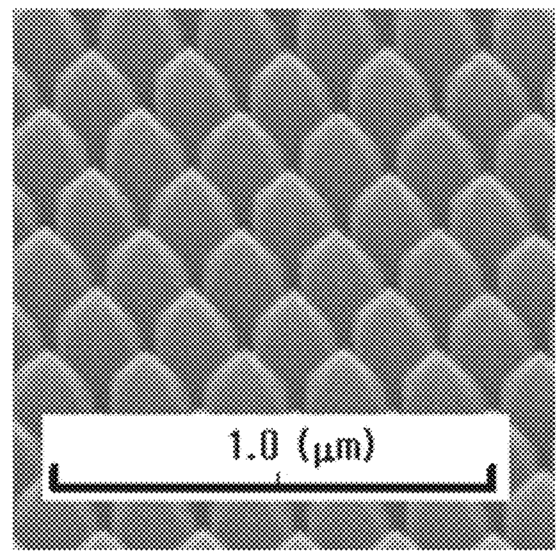
FIG. 12 is an SEM image at position A.
Figure 13:
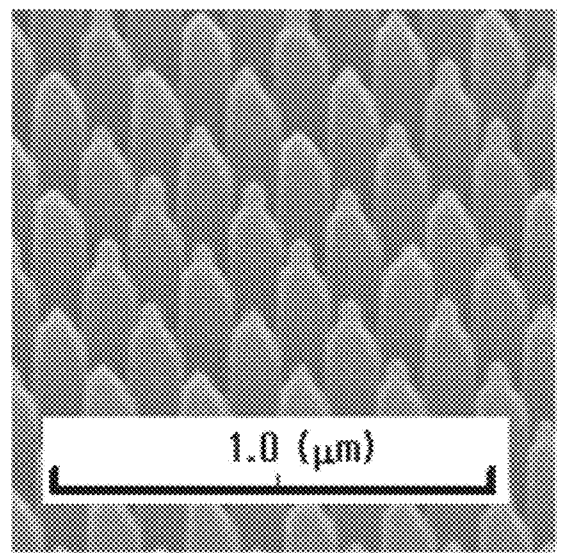
FIG. 13 is an SEM image at position B.
Figure 14:
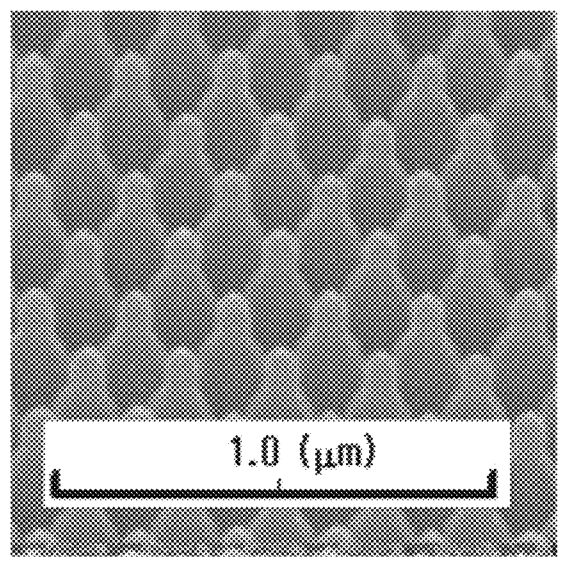
FIG. 14 is an SEM image at position C.

The sample created as described above was observed using a scanning electron microscope (SEM). FIG. 12 to FIG. 14 are bird's-eye view SEM images of the upper portion of the nanocolumn at three positions A, B and C separated 1.7 mm each apart in a plane of the same substrate.

As illustrated in FIG. 12, at position A, the shape of the apex portion of the nanocolumn was a hexagonal pyramid shape. As illustrated in FIG. 14, at position C, InGaN was aggregated in the center portion of the nanocolumn, precipitating microcrystals. As illustrated in FIG. 13, situation at position b is that the nanocolumn of position A and the nanocolumn of position C is mixed. Based on an experience, the difference in growth conditions at positions A, B and C is primarily the growth temperature. With regard to the characteristics of the RF-MBE device, the temperature at position B is lower than the temperature at position A, and the temperature at position C is lower than the temperature at position B.

Figure 15:
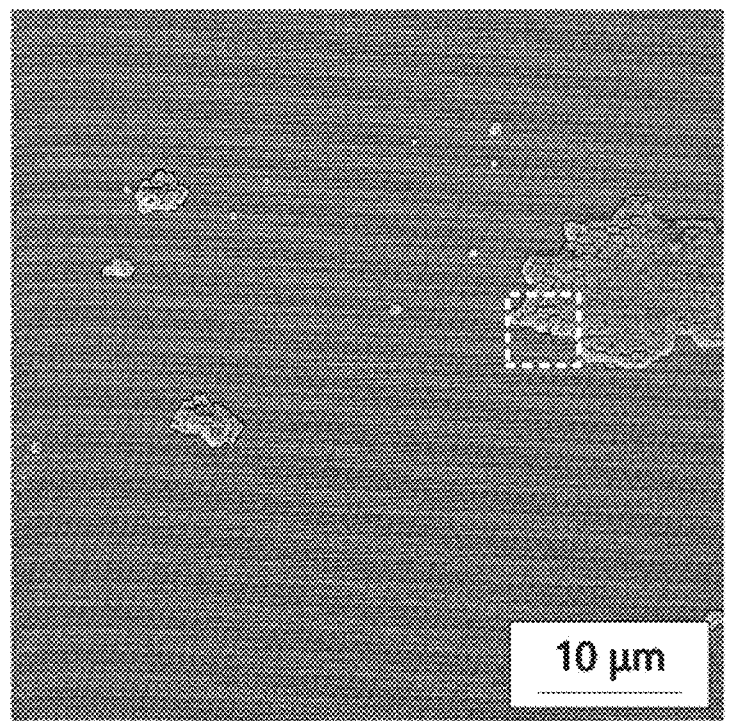
FIG. 15 is an SEM image at position D.
Figure 16:
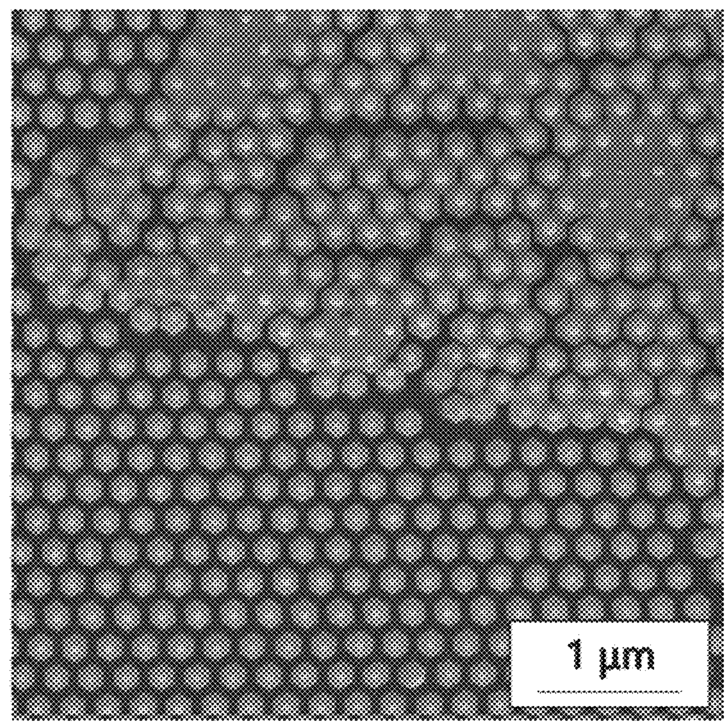
FIG. 16 is an SEM image at position D.

FIG. 15 is an SEM image at position D further separated 1.7 mm away from position C. FIG. 16 is an enlarged view of the region surrounded by the dashed line of FIG. 15. The position D is a position at which the temperature is lower than the temperature of the position C. As illustrated in FIG. 15 and FIG. 16, at position D, abnormal growth in which In was precipitated as droplets was observed. Therefore, at position D, the nanocolumns are combined to form a non-uniform shape, and the wavelength and the like change, resulting in non-homogeneous light emitting characteristics.

On the other hand, at position C, although InGaN was aggregated in the center portion of the nanocolumn, precipitation of In was not observed. This is presumably due to the removal of In during GaN growth or the temperature drop after InGaN growth.

From FIG. 12 to FIG. 16, it is considered that, as the growth temperature of InGaN is lower, the In evaporation is further suppressed, and thus, at positions A, B, C and D, the ratios of the surface stay amounts of the V group to the III group of InGaN are different.

With GaN growth by the MBE method, it is known that the surface morphology varies greatly depending on the ratio of the stay amount of the V group and the III group of GaN on the surface. Further, it is known that, by covering a crystal surface with Ga of two atomic layers using Ga excess conditions in which Ga is in excess relative to N, it is possible to promote the migration of raw material and obtain a flat film at the atomic layer level.

Even with the InGaN growth in this experiment, it is believed that, as a result of a crystal growth minimizing strain energy by In migration, InGaN crystals aggregated in the center portion of the nanocolumn.

5.1.3. Evaluation of PL Characteristics

Figure 17:
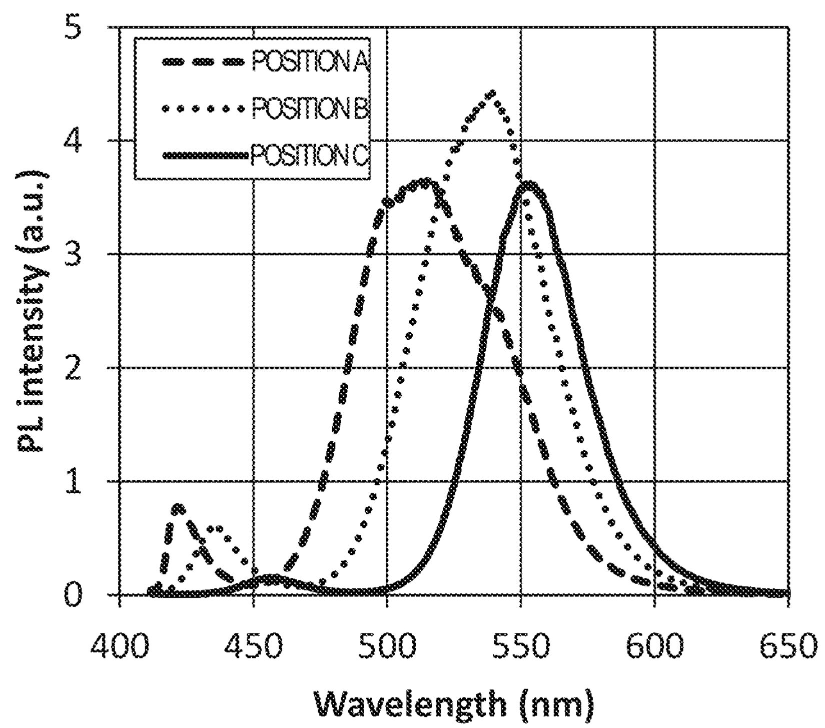
FIG. 17 is a graph illustrating the results of PL characteristics.

The above sample was evaluated for photoluminescence (PL) characteristics at room temperature. An InGaN laser having a wavelength of 405 nm was used as an excitation light source. FIG. 17 is a graph illustrating the results of PL characteristics at positions A, B and C.

As illustrated in FIG. 17, at position C, compared to positions A and B, the half width of the light emission intensity was small, and variation in the wavelength of the emitted light was minimal. As a result, it was understood that, when InGaN crystals are aggregated in the center portion of the nanocolumn, light having a high pure color property can be emitted.

Since the ratio of the In incorporated into the crystal depends on the growth surface, when InGaN is also grown on a faceted surface as in position A, and the shape of the nanocolumn is a hexagonal pyramid, it is believed that In is distributed throughout the entire planar direction of the nanocolumn, and the half width of the light emission intensity increases. On the other hand, when InGaN is aggregated as at position C, it is believed that, due to the growth of InGaN substantially in the c-axis direction, the distribution of In throughout the entire planar direction of the nanocolumn is suppressed, and the half width of the light emission intensity is small.

5.2. Second Experiment

Figure 18:
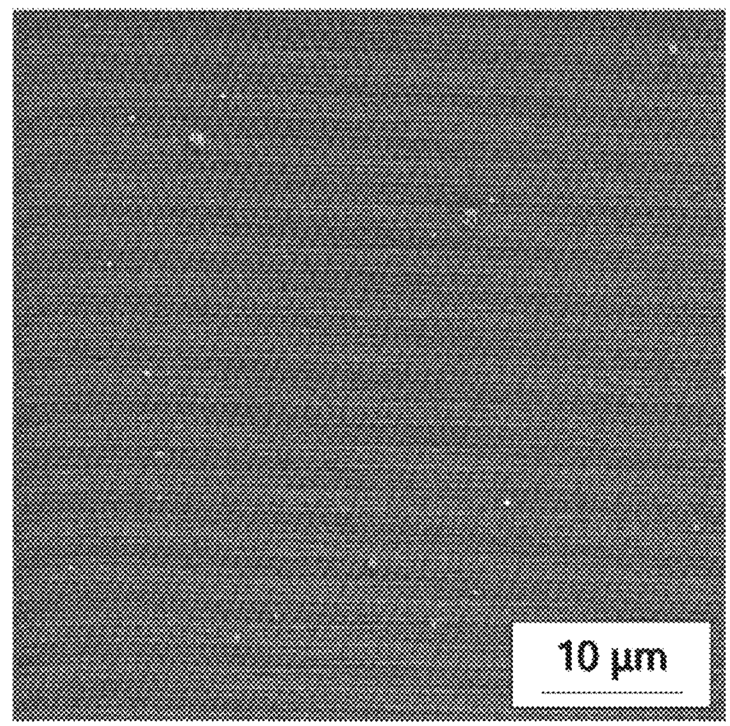
FIG. 18 is an SEM image.

Instead of growing InGaN as in the first experiment described above, InGaN and GaN were alternating grown to form a nanocolumn. Specifically, InGaN was grown for 3.5 minutes followed by GaN for 2.0 minutes, repeatedly six times. FIG. 18 is an SEM image of a sample thus fabricated.

As illustrated in FIG. 18, abnormal growth of the 10 μm order by precipitation of excessive In was not observed. Thus, it was found that abnormal growth caused by the precipitation of excessive In can be suppressed by alternately growing InGaN and GaN. Note that while abnormal growth of a size of about 1 μm can be seen here and there in FIG. 18, such growth is not limited to growth caused by the precipitation of excessive In, and may occur by a process before formation of the nanocolumn or by the environment of the growth device.

In the first experiment, it is not easy to apply the position C at which abnormal growth due to precipitation of In was not observed to the entire surface of the substrate. However, in the second experiment, conceivably the In precipitated can be removed by GaN before excessive In precipitates as droplets and starts abnormal growth, and abnormal growth can be suppressed in an area wider than the substrate.

As long as the features and effects described herein are provided, a portion of the configurations of the present disclosure may be omitted, and the various embodiments and modified examples may be combined.

The present disclosure is not limited to the embodiments described above, and various modifications are further possible. For example, the present disclosure includes configurations that are substantially the same (for example, in function, method, and results, or in objective and effects) as the configurations described in the embodiments. The present disclosure also includes configurations in which non-essential elements described in the embodiments are replaced by other elements. The present disclosure also includes configurations having the same effects as those of the configurations described in the embodiments, or configurations capable of achieving the same objectives as those of the configurations described in the embodiments. The present disclosure further includes configurations obtained by adding known art to the configurations described in the embodiments.

Some embodiments of the present disclosure have been described in detail above, but a person skilled in the art will readily appreciate that various modifications can be made from the embodiments without materially departing from the novel teachings and effects of the present disclosure. Accordingly, all such modifications are assumed to be included in the scope of the present disclosure.

What is claimed is:

1. A light emitting device comprising:

a substrate; and a laminate provided to the substrate and including a plurality of columnar portions, each of the plurality of columnar portions including a light emitting layer, and the following relations being satisfied, $$(b-a)/L1>(d-c)/L2,$$

$$a<b,$$

$$c<d, \text{ and}$$

$$a<d,$$

where a is a maximum width of each of the columnar portions as viewed from a laminating direction of the laminate, at a first position of each of the columnar portions closest to the substrate in the laminating direction, b is a maximum width of each of the columnar portions as viewed from the laminating direction, at a second position of the light emitting layer closest to the substrate in the laminating direction, c is a maximum width of each of the columnar portions as viewed from the laminating direction, at a third position of the light emitting layer farthest from the substrate in the laminating direction, d is a maximum width of each of the columnar portions as viewed from the laminating direction, at a fourth position of the columnar portion farthest from the substrate in the laminating direction, and L1 is a distance between the first position and the second position and L2 is a distance between the third position and the fourth position in the laminating direction.

2. A light emitting device comprising:

a substrate;

a laminate provided to the substrate and including a plurality of columnar portions; and an electrode provided to the laminate on a side opposite the substrate side, each the plurality of columnar portions including a light emitting layer, and the following relations being satisfied, $$(b-a)/L1>(d-c)/L2,$$

$$a<b,$$

$$c<d, \text{ and}$$

$$a<d,$$

where a is a maximum width of each of the columnar portions as viewed from a laminating direction of the laminate, at a first position of the columnar portion closest to the substrate in the laminating direction, b is a maximum width of each of the columnar portions as viewed from the laminating direction, at a second position of the light emitting layer closest to the substrate in the laminating direction, c is a maximum width of each of the columnar portions as viewed from the laminating direction, at a third position of the light emitting layer farthest from the substrate in the laminating direction, d is a maximum width of each of the columnar portions as viewed from the laminating direction, at a fourth position of a contact region of the columnar portion with the electrode closest to the substrate in the laminating direction, and L1 is a distance between the first position and the second position and L2 is a distance between the third position and the fourth position in the laminating direction.

3. The light emitting device according to claim 1, wherein the light emitting layer includes a first portion, and a second portion having an In concentration lower than the In concentration of the first portion, and wherein the second portion surrounds the first portion when viewed from the laminating direction.

4. The light emitting device according to claim 3, wherein the light emitting layer includes a plurality of the first portions, wherein the plurality of the first portions are arranged side by side in the laminating direction, and wherein the second portion is provided between the first portions adjacent to each other.

5. The light emitting device according to claim 1, wherein each of the plurality of columnar portions includes a first semiconductor layer, and a second semiconductor layer of a conductivity type different from the conductivity type of the first semiconductor layer, and wherein the light emitting layer is provided between the first semiconductor layer and the second semiconductor layer.

6. A projector comprising the light emitting device described in claim 1.

7. The light emitting device according to claim 2, wherein the light emitting layer includes a first portion, and a second portion having an In concentration lower than the In concentration of the first portion, and wherein the second portion surrounds the first portion when viewed from the laminating direction.

8. The light emitting device according to claim 7, wherein the light emitting layer includes a plurality of the first portions, wherein the plurality of the first portions are arranged side by side in the laminating direction, and wherein the second portion is provided between the first portions adjacent to each other.

9. The light emitting device according to claim 2, wherein each of the plurality of columnar portions includes a first semiconductor layer, and a second semiconductor layer of a conductivity type different from the conductivity type of the first semiconductor layer, and wherein the light emitting layer is provided between the first semiconductor layer and the second semiconductor layer.

10. A projector comprising the light emitting device described in claim 2.

* * * * *